United States Patent [19]

Chaki

[11] Patent Number: 4,498,064

[45] Date of Patent: Feb. 5, 1985

[54] PUSHBUTTON TUNER WITH STAGGERED TUNING COILS

[75] Inventor: Takao Chaki, Tokyo, Japan

[73] Assignee: Clarion Co., Ltd., Tokyo, Japan

[21] Appl. No.: 439,112

[22] Filed: Nov. 4, 1982

[30] Foreign Application Priority Data

Nov. 6, 1981 [JP] Japan ............................. 56-164913[U]

[51] Int. Cl.³ ................................................ H03J 5/32
[52] U.S. Cl. ........................................... 334/7; 334/74; 74/10.33; 336/131; 336/136; 336/65
[58] Field of Search ................... 334/7, 74, 76, 77, 89; 74/10.33, 10.37; 336/103-132, 136, 65

[56] References Cited

U.S. PATENT DOCUMENTS

| | | | |
|---|---|---|---|
| 2,487,385 | 11/1949 | Schaper | 336/131 |
| 2,521,968 | 9/1950 | De Tan et al. | 334/77 |
| 2,555,475 | 6/1951 | Dewhurst | 334/77 |
| 3,218,591 | 11/1965 | Caruthers | 336/131 |

FOREIGN PATENT DOCUMENTS 722240  1/1943  Fed. Rep. of Germany ........ 334/74

Primary Examiner—Eugene R. LaRoche
Assistant Examiner—Benny Lee
Attorney, Agent, or Firm—Russel E. Hattis

[57] ABSTRACT

A pushbutton tuner wherein tuning coils are disposed in two decks, upper and lower, and the upper or lower tuning coils are disposed in front of the others. A printed circuit board to be connected to said tuning coils by lead wires is divided in two parts and each part is disposed close to the tuning coils in the associated deck.

4 Claims, 5 Drawing Figures

PUSHBUTTON TUNER WITH STAGGERED TUNING COILS

BACKGROUND OF THE INVENTION

1. Field of the Invention

This invention relates to a pushbutton tuner, and more particularly to an improvement of placement of tuning coils so as to permit reduction in thickness of the pushbutton tuner.

2. Description of the Prior Art

In case of a pushbutton tuner, tuning is performed by the following operations: a pushbutton is pushed in; a button slide which carries the pushbutton moves inward of the tuner in accordance with movement of the pushbutton; a core mounted on a core slide which moves simultaneously with the button slide advances in the center of an associated tuning coil; and the amount of advancement of the core in the coil determines frequency to be received.

Such pushbutton tuner has a plurality of tuning coils. These coils have generally been disposed in alignment with the main surfaces thereof being in substantially same plane in the prior art. However, when the coils are disposed in this manner, the total width of the coils becomes so wide as to disturb placement of other members or to increase the size of the tuner normally enclosed in a housing.

In this connection, it has been proposed, also, to dispose the coils in two steps. FIG. 1 shows a part of such a conventional tuner in which the coils 1a and 1b are secured to a terminal board 2 as they are in two-decker state. The cores 3a and 3b advance in the coils 1a and 1b in response to advancement of a core slide 4 which moves simultaneously with a pivotal crank (not shown). The terminal board 2 is connected to a printed circuit board 6 by lead wires 7a and 7b.

In the pushbutton tuner of FIG. 1 with coils in two-decker arrangement, however, the height h at the portion of the tuning coils increases to thereby disturb reduction in size and thickness of the tuner. Further, since one of the lead wires 7a and 7b is inevitably longer, electric characteristic becomes bad particularly upon FM broadcasting reception.

OBJECT OF THE INVENTION

It is therefore an object of the present invention to overcome the aforementioned drawbacks in the prior art, by providing a pushbutton tuner with good electric characteristic by improving placement of the coils so as to permit reduction in thickness of the tuner and to shorten all the lead wires.

SUMMARY OF THE INVENTION

In accordance with the present invention, there is provided a pushbutton tuner wherein tuning coils are disposed in two decks and located in different positions in the forward-rearward direction as viewed from the front face, of the tuner, and a printed circuit board to be connected to the tuning coils by lead wires is divided in two parts, upper and lower so as to be closely disposed to the tuning coils in respective decks.

DETAILED DESCRIPTION OF THE PREFERRED EMBODIMENTS

Figure 1:
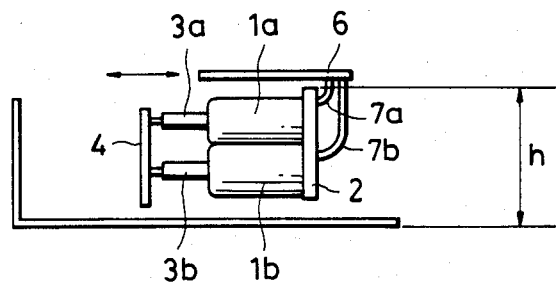
FIG. 1 is a side elevation of the arrangement of prior art tuning coils of a conventional pushbutton tuner.

The present invention will now be described in detail by way of the preferred embodiments referring to the drawings.

Figure 2A:
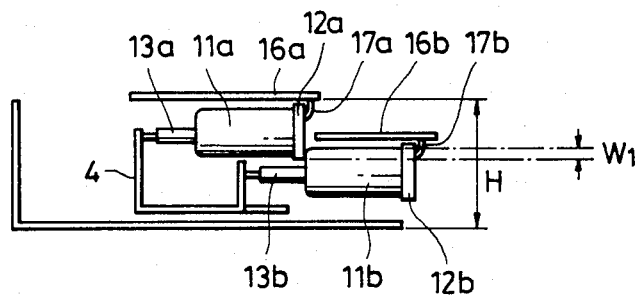
FIG. 2A is a side elevation of the arrangement of the tuning coils in an embodiment of the pushbutton tuner according to the present invention.

In the embodiment of FIG. 2A, tuning coils 11a and 11b are disposed in two decks and with the upper or lower coils being different in positions in the frontward-rearward direction of the tuner, as viewed from the left-hand portion of FIG. 2(A). In this case, the rear tuning coil 11b overlaps the front tuning coil 11a in height as much as W1 to an extent not to disturb advancement of associated cores 13a and 13b. Each core slide 4 to be displaced by a known core shift mechanism is U-shaped in its side view and arranged to permit the cores 13a and 13b to advance in the tuning coils 11a and 11b a given amount not to cause trouble as compared with the conventional one.

The printed circuit board on which tuning circuits are printed as conventionally known are divided in two parts, namely upper and lower parts 16a and 16b. The parts 16a and 16b of the prited circuit board are disposed close to the front and rear tuning coils 11a and 11b, respectively.

The terminal boards 12a and 12b of the tuning coils 11a and 11b and the associated parts 16a and 16b of the printed circuit board have the same relative position with respect to each other and are connected by lead wires 17a and 17b, respectively, which are of equal length so that the electric characteristics do not vary.

To divide the printed circuit board in two parts and dispose the individual parts close to the tuning coils leads to reduction in length of the lead wires. Placement of the upper and lower tuning coils in different positions or end-to-end in the front-rearward direction of the tuner permits overlap of the upper and lower tuning coils in height to an extent W1 not to disturb advancement of the coils. Therefore, the total height C1 of the coils becomes lower than the conventional construction wherein the upper and lower coils are disposed one over one, resulting in reduction of the height H [FIG. 2(A)] of the tuner as a whole.

Figure 2B:
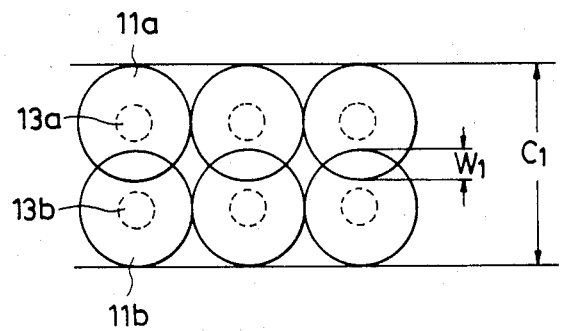
FIG. 2B is a front elevation of the pushbutton tuner shown in FIG. 2(A)
Figure 2:
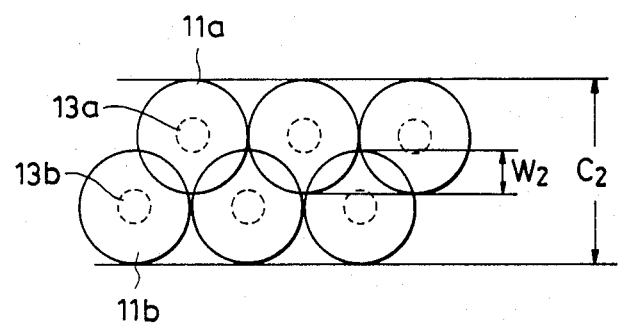
FIG. 2C is a front elevation showing a modification of placement of the tuning coils.

More specifically, as illustrated in FIGS. 2(A) and 2(B), the circular coils have their center cores or the center axes thereof vertically aligned in transversely-spaced pairs and have peripheral overlapping portions defining an overlapping dimension W1 which thus reduces the vertical space requirement for the overall vertical dimension of the tuner casing in which the coils are located. This overall reduced vertical spacing is accomplished by having the respective pairs of coils in end-to-end relation with their axes vertically offset, as clearly shown in FIG. 2(A). Thus, the unit is most compact in a vertical, as well as transverse, dimension when viewed from the front of the unit, FIG. 2(B).

The upper and lower tuning coils may also be disposed in different positions in right-left direction of the tuner as shown in FIG. 2C which is a front elevational view of the pushbutton tuner so that the cores to be inserted in the rear tuning coils may pass through the valley defined between respective adjacent front coils. With this arrangement, the upper and lower coils may overlap in their height to a larger extent W2 then W1 of FIG. 2B, so that the total height C2 of the upper and lower tuning coils becomes smaller as compared the height C1 in FIG. 2B.

Figure 3:
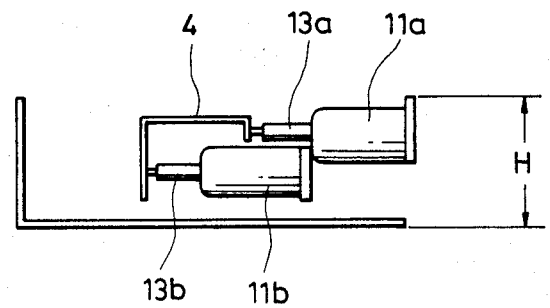
FIG. 3 is a side elevation of another embodiment of the pushbutton tuner according to the present invention.

In the embodiment illustrated in FIGS. 2(C) and 3, the centers of the coils 11a are generally horizontally aligned with each other, while the centers of the lower coils are also generally horizontally aligned. The two sets of coils 11a and 11b are again positioned in generally end-to-end relation to provide a vertical overlap, identified by the dimension W2. In this embodiment, the centers of the upper coils 11a are transversely staggered with respect to centers of the lower coils 11b so that the center of one upper coil 11a is approximately equidistant transversely between the centers of the two adjacent lower coils 11b, and vice versa, as clearly illustrated in FIG. 2(C). This vertical overlap and transverse staggering minimizes the vertical space requirements, while still allowing for unobstructed movement of the respective center tuning cores 13a and 13b with respect to the adjacent larger circular tuning coils 11a and 11b.

In this embodiment, the circuit boards, which are not shown in FIG. 3, are preferably separated into two segments, as shown at 16a and 16b in FIG. 2(A). Thus, the two segments can readily be located directly adjacent the respective coils 11a and 11b so that the lead wires 17a and 17b will have a minimum length and are equal in length to eliminate variations in frequency transmissions between the respective coils and associated printed circuit boards.

As described in the above, according to the present invention, short lead wires for connecting the printed circuit board and the coils leads to improvement of electric characteristic. This effect is particularly large in case of FM broadcasting selection. Shortening of the lead wires leads to simplification of design of circuit arrangement for the printed circuit board and the tuning coils and simplification of mounting process. When locating the upper and lower tuning coils to overlap each other in height to an extent, height of the pushbutton tuner can be reduced.

I claim:

1. A pushbutton tuner comprising a plurality of tuning coils supported in a casing and each having a tuning core movable therein for varying the frequency thereof with a terminal board secured to said coils and connected to a circuit board, the improvement of said tuning coils being arranged in vertically-spaced pairs and having horizontally-extending axes with adjacent coils in respective pairs being in end-to-end relation and having overlapping height portions when viewed from the ends of said coils to minimize the space requirement for the coils in the casing.

2. A pushbutton tuner as defined in claim 1, in which the upper coils of each pair have centers generally horizontally aligned and the lower coils of each pair having centers generally horizontally aligned.

3. A pushbutton tuner as defined in claim 2, in which the centers of the upper coils are horizontally staggered with respect to the centers of the lower coils.

4. A pushbutton tuner as defined in claim 3, in which the upper coils have centers equally horizontally staggered with respect to centers of the lower coils.

* * * * *